(12) United States Patent
Cook et al.

(10) Patent No.: US 11,728,242 B2
(45) Date of Patent: Aug. 15, 2023

(54) SEMICONDUCTOR DIE ORIFICES CONTAINING METALLIC NANOWIRES

(71) Applicant: TEXAS INSTRUMENTS INCORPORATED, Dallas, TX (US)

(72) Inventors: Benjamin Stassen Cook, Los Gatos, CA (US); Ralf Jakobskrueger Muenster, Saratoga, CA (US); Sreenivasan Kalyani Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/843,618

(22) Filed: Apr. 8, 2020

(65) Prior Publication Data

US 2020/0321267 A1 Oct. 8, 2020

Related U.S. Application Data

(60) Provisional application No. 62/831,023, filed on Apr. 8, 2019.

(51) Int. Cl.
| | |
|---|---|
| *H01L 23/48* | (2006.01) |
| *H01L 21/768* | (2006.01) |
| *H01L 23/495* | (2006.01) |
| *H01L 23/00* | (2006.01) |
| *H01L 21/288* | (2006.01) |

(52) U.S. Cl.
CPC ...... *H01L 23/481* (2013.01); *H01L 21/76898* (2013.01); *H01L 23/49575* (2013.01); *H01L 24/32* (2013.01); *H01L 24/33* (2013.01); *H01L 24/73* (2013.01); *H01L 21/2885* (2013.01); *H01L 2224/32146* (2013.01); *H01L 2224/73265* (2013.01)

(58) Field of Classification Search
CPC ........... H01L 21/76898; H01L 21/2885; H01L 23/481; H01L 23/49575; H01L 24/32; H01L 24/33; H01L 24/73; H01L 2224/32146; H01L 2224/73265
See application file for complete search history.

(56) References Cited

U.S. PATENT DOCUMENTS

| | | | | |
|---|---|---|---|---|
| 2009/0321892 | A1* | 12/2009 | Bae | H01L 24/05 257/621 |
| 2010/0072606 | A1* | 3/2010 | Yang | H01L 24/82 257/692 |
| 2012/0326310 | A1* | 12/2012 | Busnaina | H01L 23/53276 257/746 |
| 2013/0147044 | A1* | 6/2013 | Eun | H01L 23/49816 257/738 |
| 2017/0323867 | A1* | 11/2017 | Wang | H01L 24/11 |
| 2018/0174999 | A1* | 6/2018 | Modi | H01L 21/78 |
| 2019/0319006 | A1* | 10/2019 | Hung | H01L 24/05 |

* cited by examiner

*Primary Examiner* — Herve-Louis Y Assouman
(74) *Attorney, Agent, or Firm* — Ronald O. Neerings; Frank D. Cimino

(57) ABSTRACT

In some examples, a semiconductor package comprises a semiconductor die having a first surface and a second surface opposing the first surface. The package comprises an orifice extending through a thickness of the semiconductor die from the first surface to the second surface. The package comprises a set of metallic nanowires positioned within the orifice and extending through the thickness of the semiconductor die from the first surface to the second surface.

25 Claims, 15 Drawing Sheets

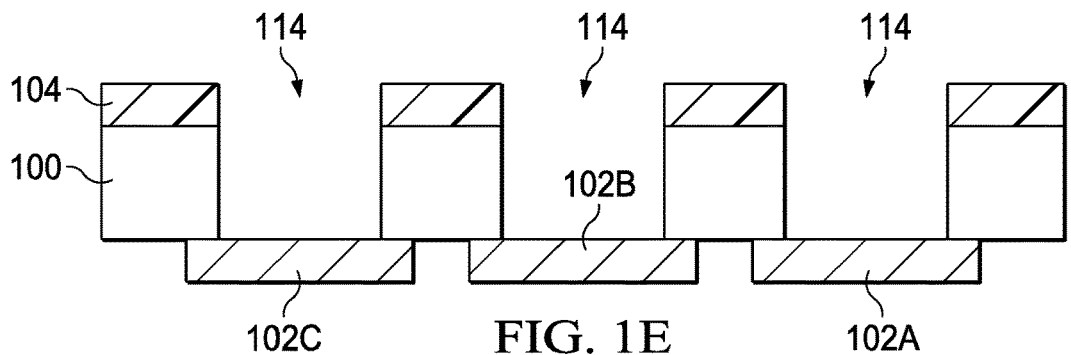
FIG. 1E
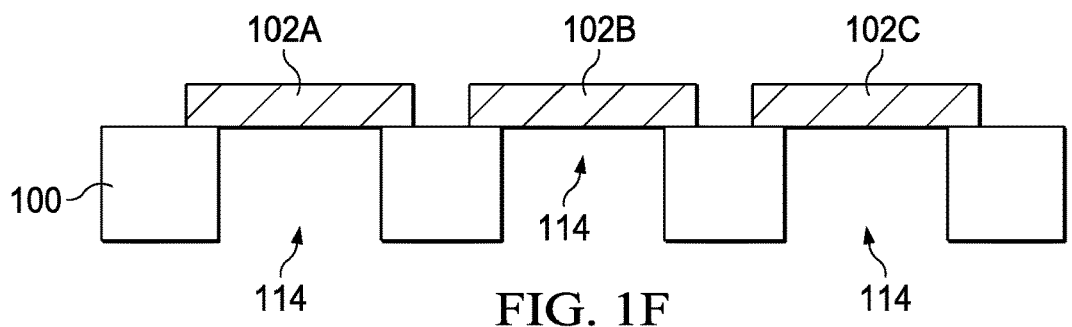
FIG. 1F
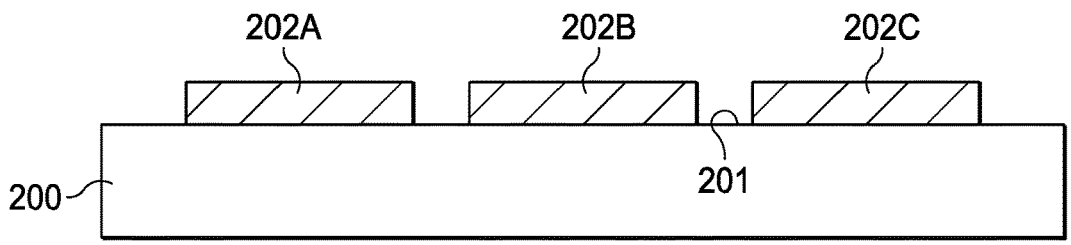
FIG. 2A1
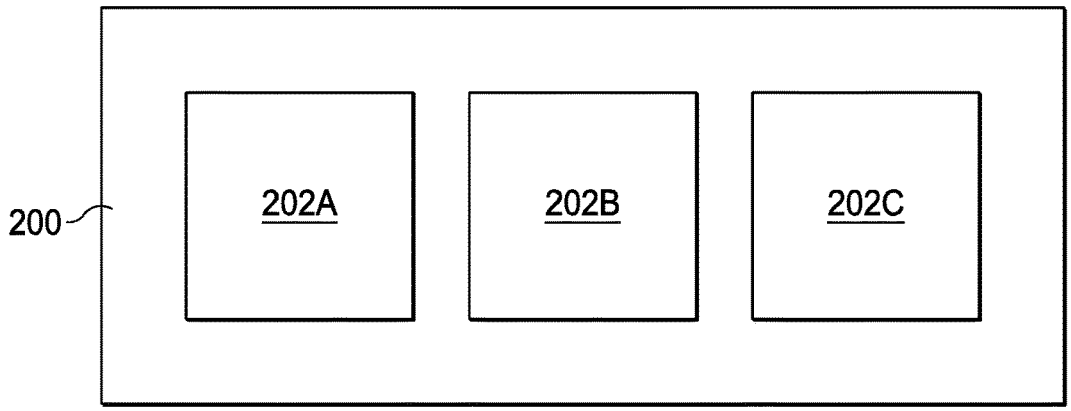
FIG. 2A2

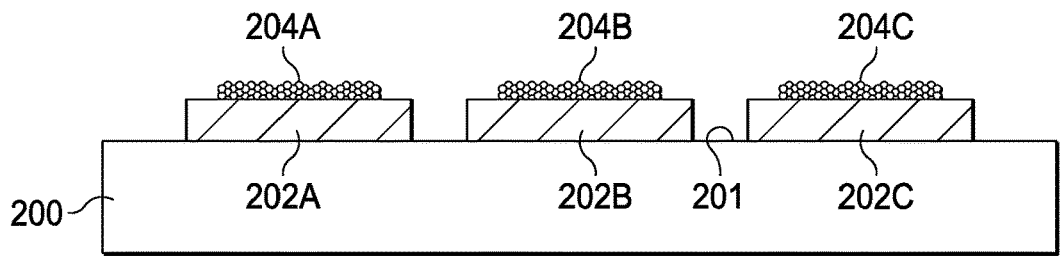
FIG. 2B1
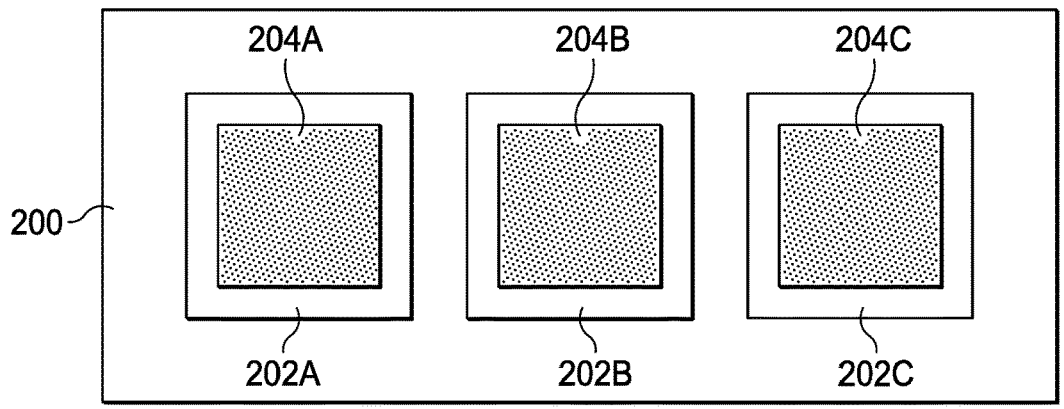
FIG. 2B2
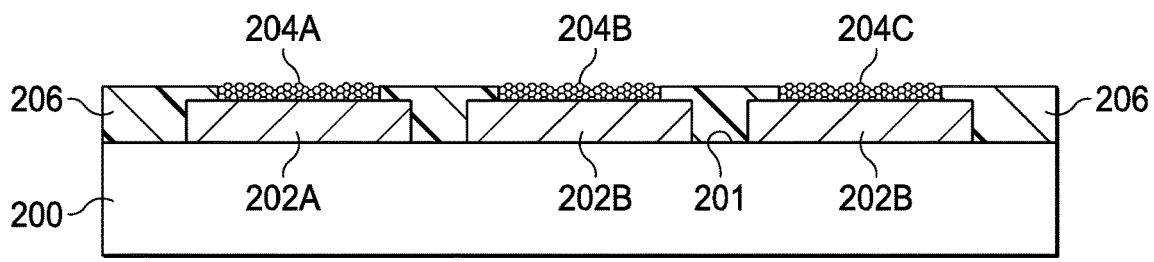
FIG. 2C1
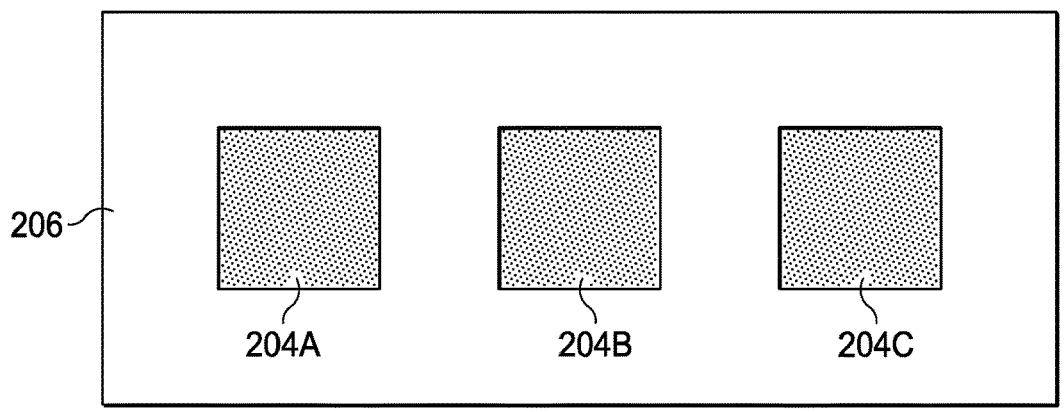
FIG. 2C2

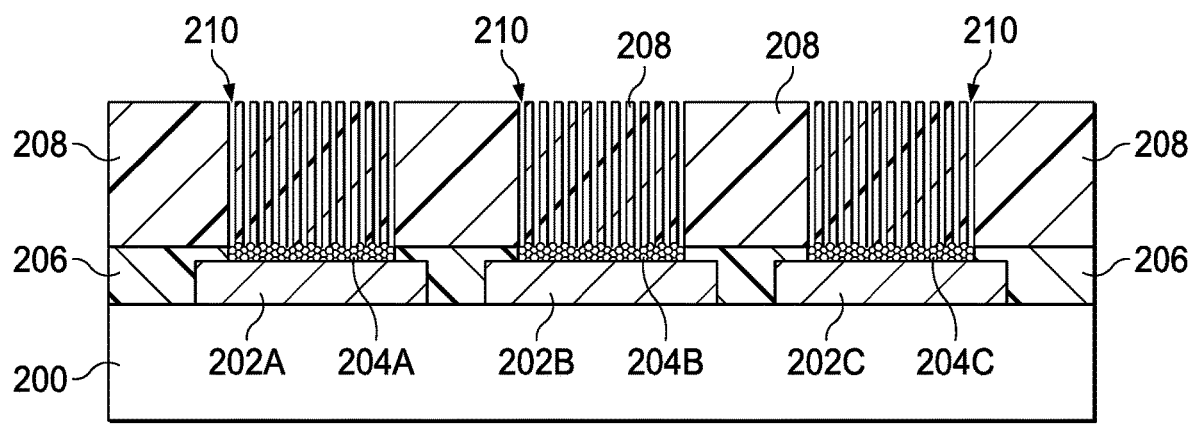
FIG. 2D1
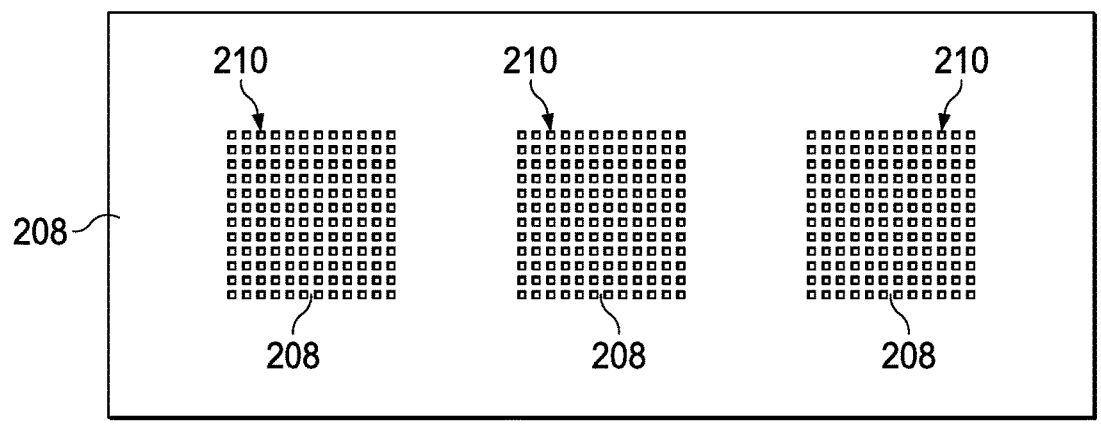
FIG. 2D2
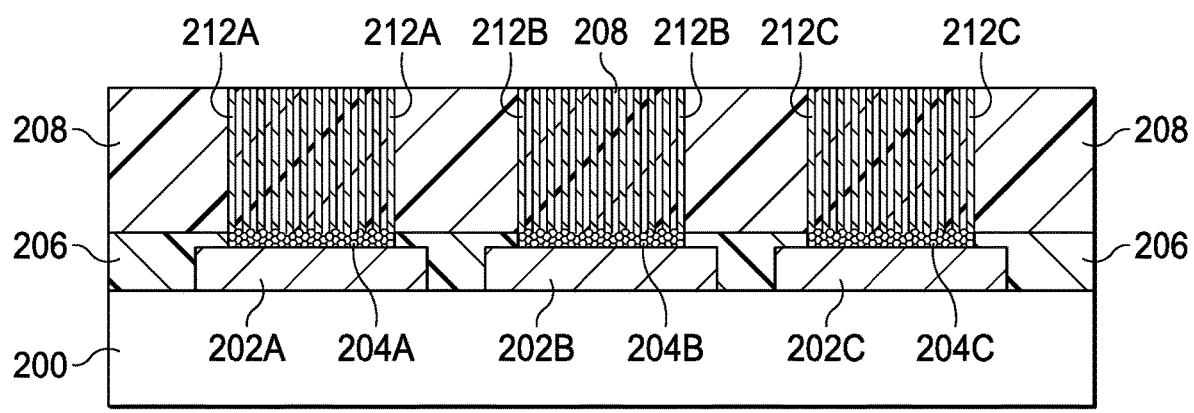
FIG. 2E1

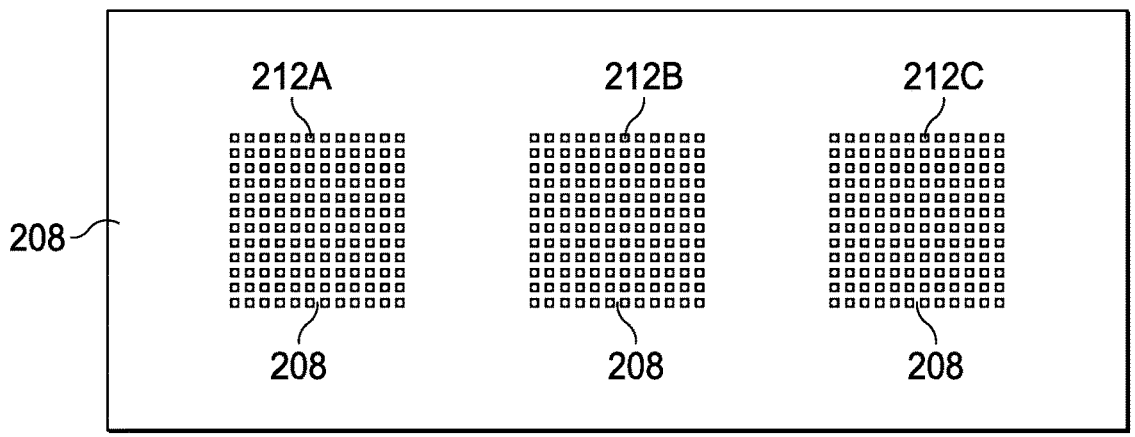
FIG. 2E2
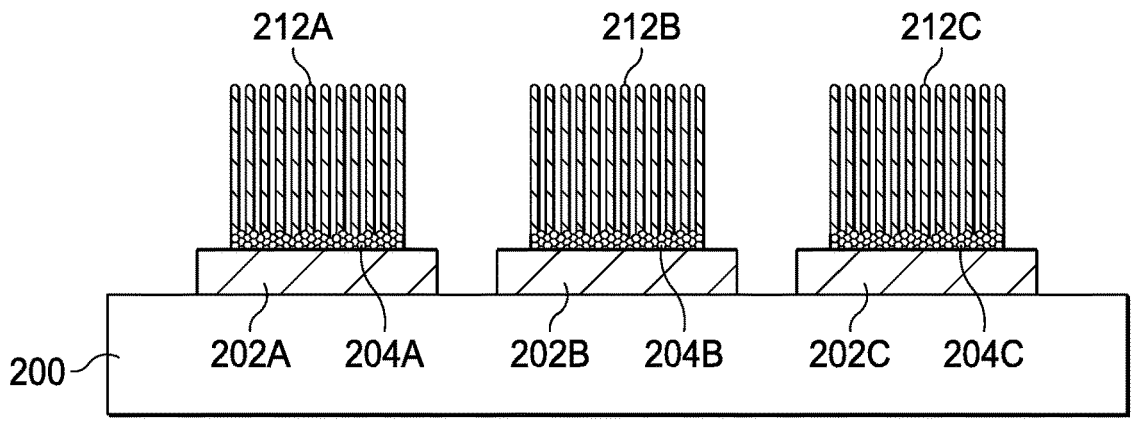
FIG. 2F1
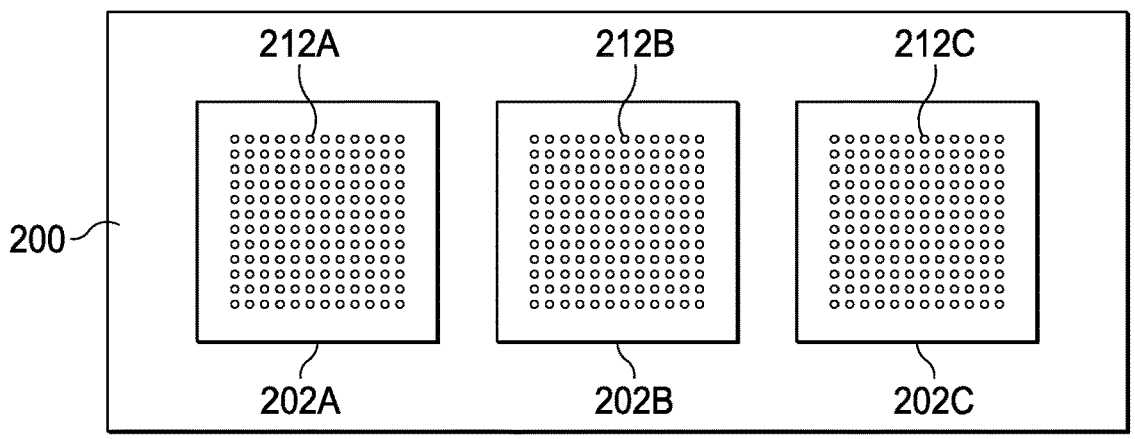
FIG. 2F2

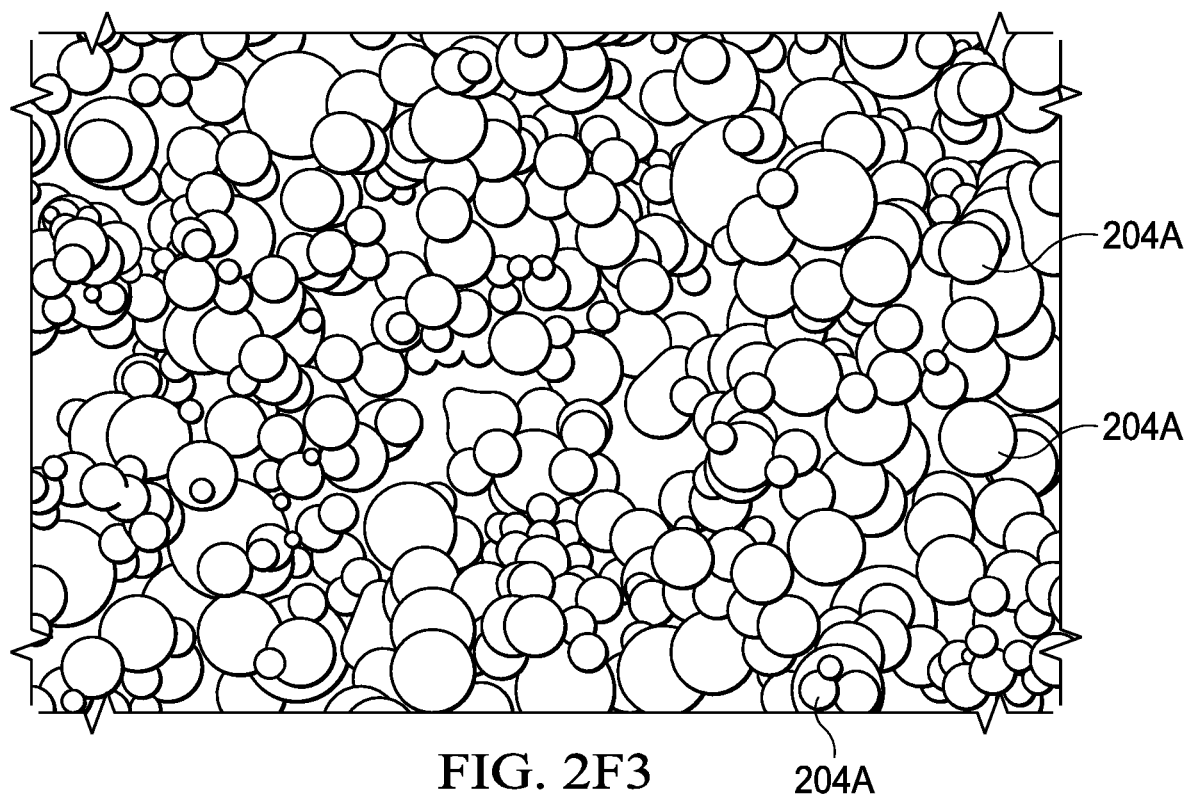
FIG. 2F3

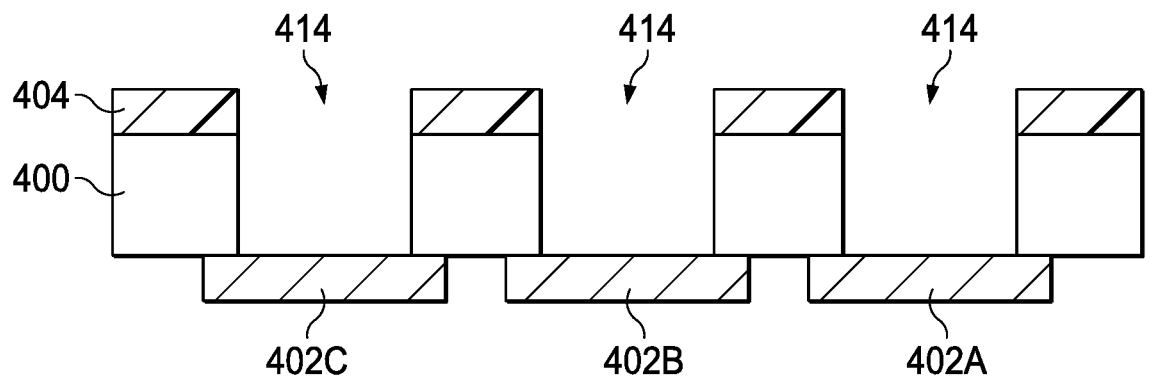
FIG. 4E
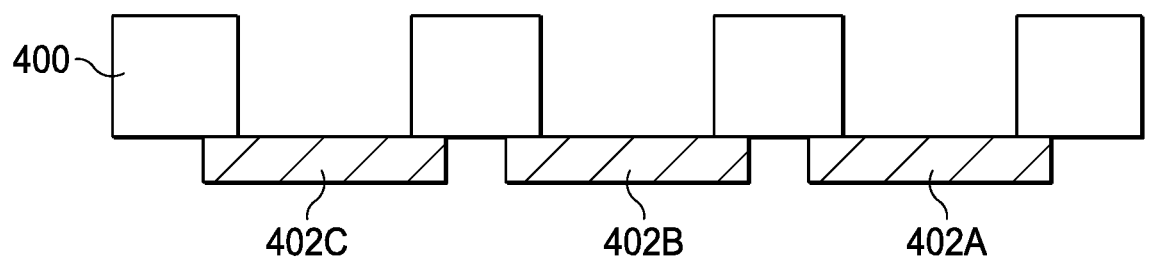
FIG. 4F1
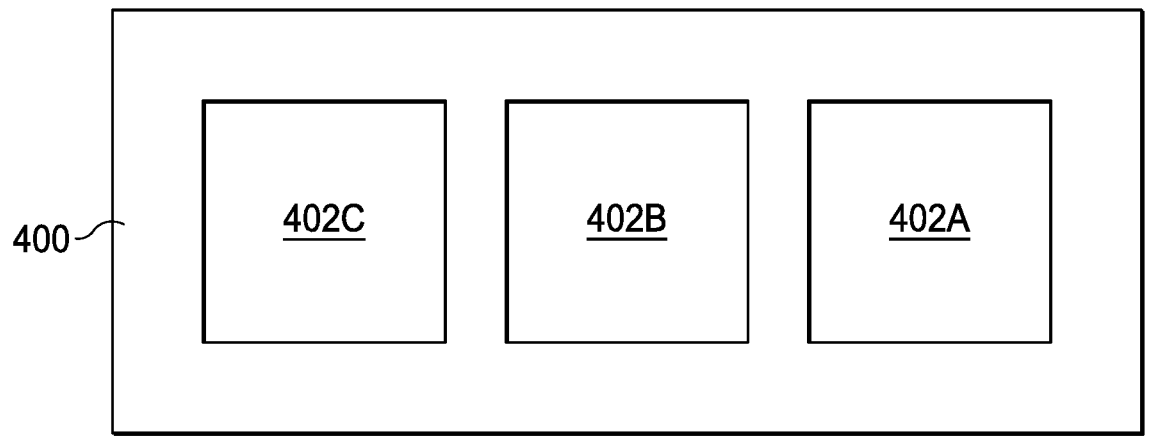
FIG. 4F2

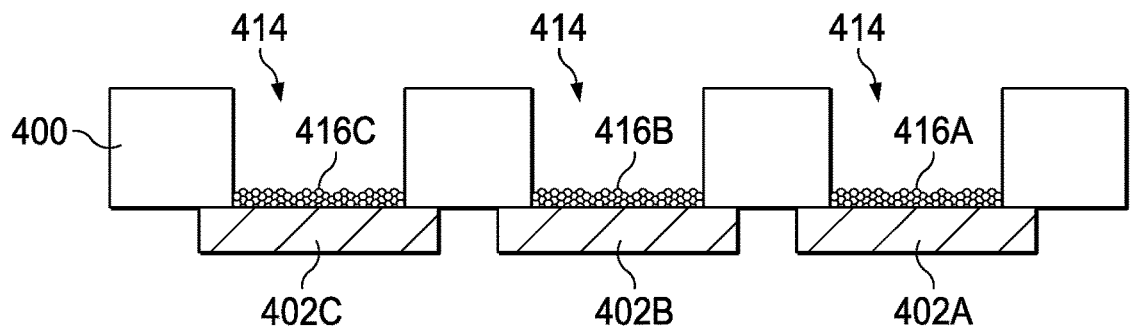
FIG. 4G1
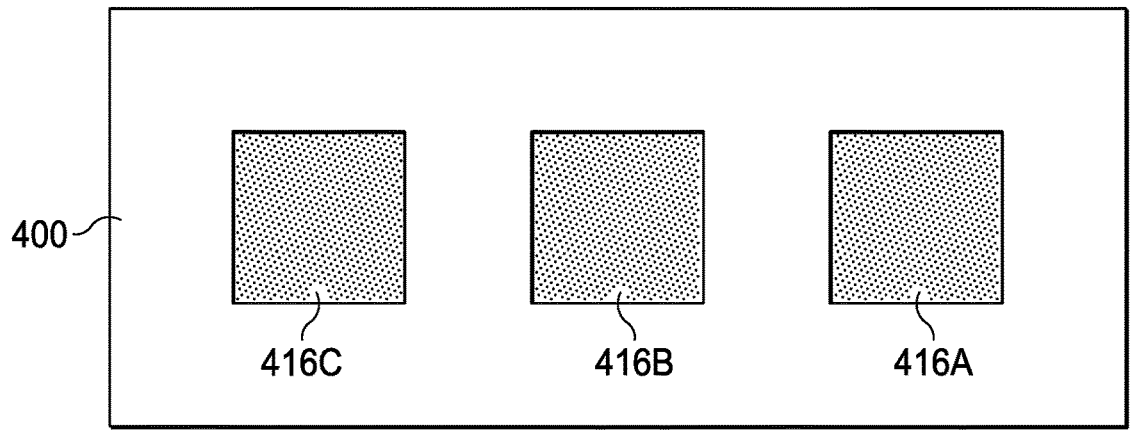
FIG. 4G2
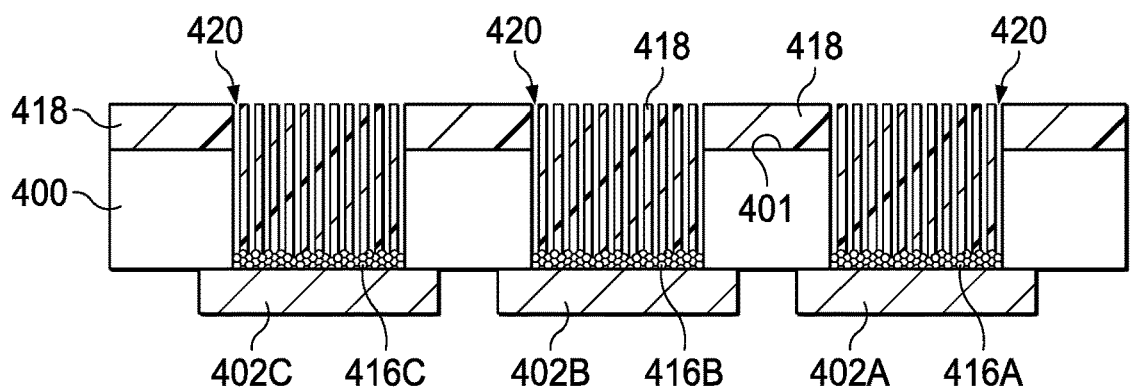
FIG. 4H1

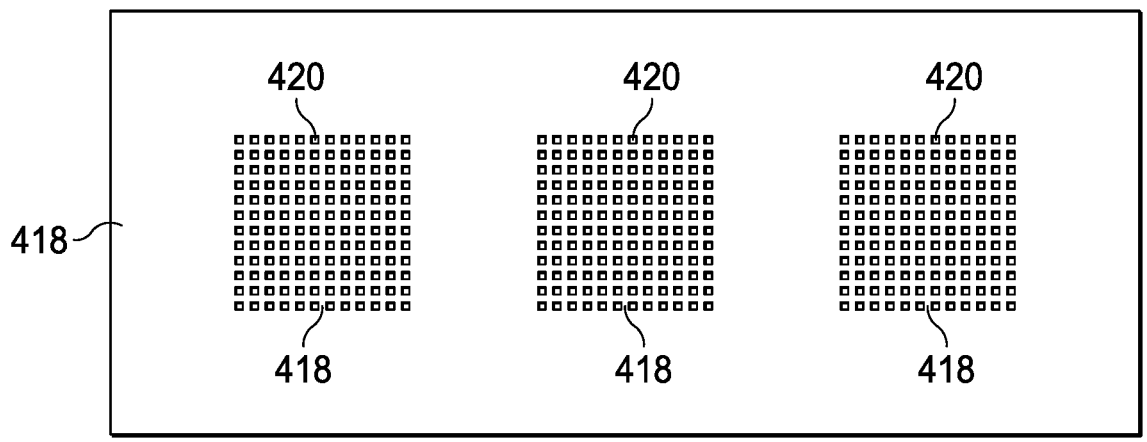
FIG. 4H2
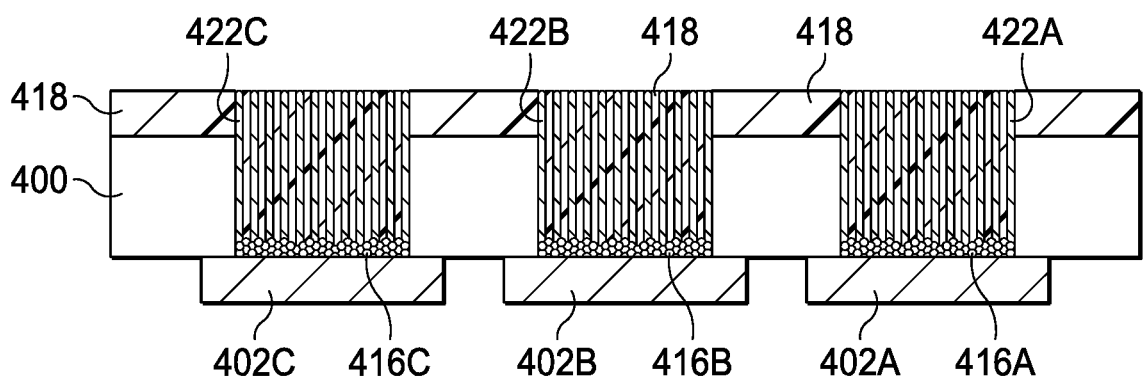
FIG. 4I1
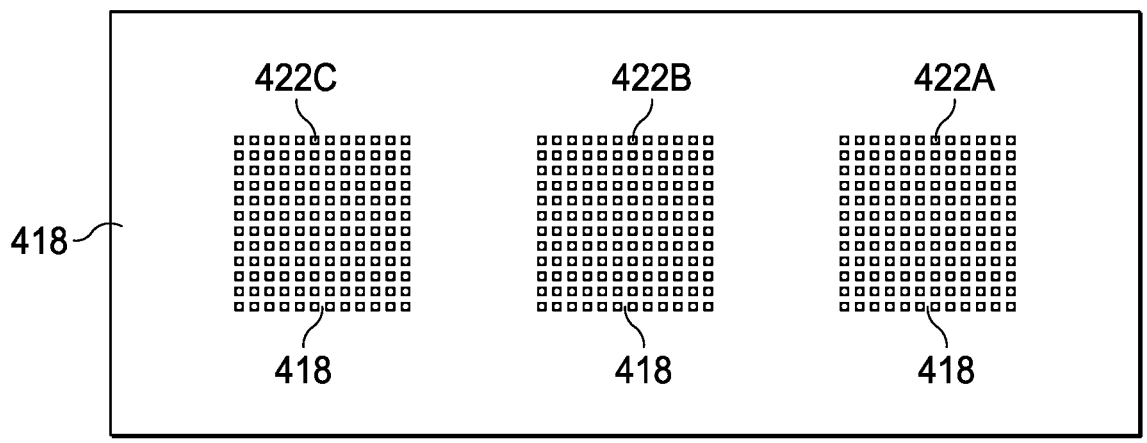
FIG. 4I2

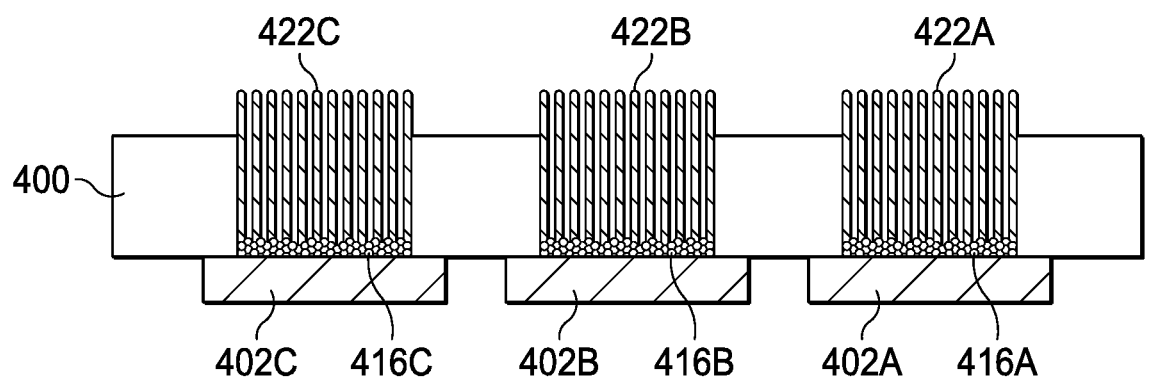
FIG. 4J1
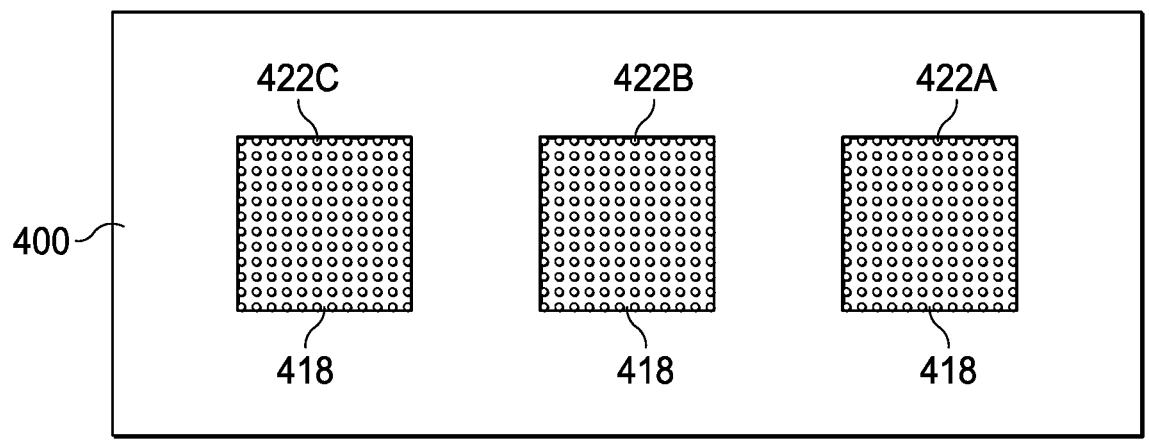
FIG. 4J2
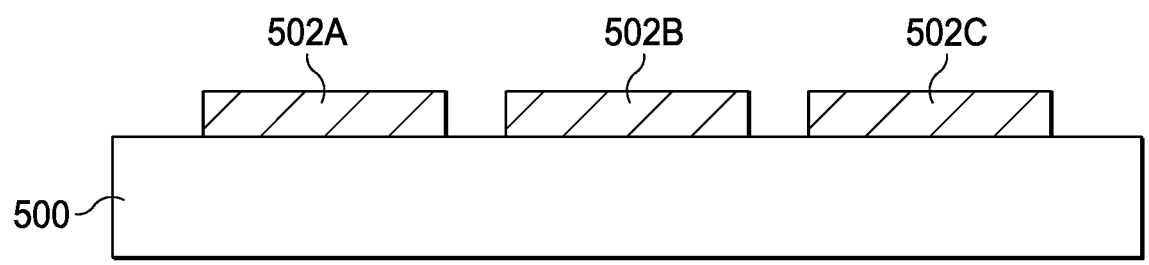
FIG. 5

SEMICONDUCTOR DIE ORIFICES CONTAINING METALLIC NANOWIRES

CROSS-REFERENCE TO RELATED APPLICATIONS

The present application claims priority to U.S. Provisional Patent Application No. 62/831,023, which was filed Apr. 8, 2019, is titled "Nanowire TSV," and is hereby incorporated herein by reference in its entirety.

BACKGROUND

Semiconductor packages typically contain one or more semiconductor dies. Each such semiconductor die includes one or more active surfaces with circuitry formed thereupon. Each active surface of a semiconductor die may couple to another electrical component within the semiconductor package (e.g., a conductive terminal such as a lead, another active surface of the semiconductor die, an active surface of another semiconductor die). Such couplings may be established through a variety of conductive connections, for example, bond wires, clips, and through-silicon vias (TSVs). TSVs are metal-containing orifices that pass through the thickness of a silicon (or other semiconductor) die, from one surface of the semiconductor die to an opposing surface of the semiconductor die. Such TSVs facilitate electrical communication between the two surfaces of the semiconductor die. Alternatively, a TSV may facilitate electrical communication between an active surface of a semiconductor die and an active surface of another semiconductor die located adjacent to the semiconductor die that contains the TSV.

SUMMARY

In some examples, a semiconductor package comprises a semiconductor die having a first surface and a second surface opposing the first surface. The package comprises an orifice extending through a thickness of the semiconductor die from the first surface to the second surface. The package comprises a set of metallic nanowires positioned within the orifice and extending through the thickness of the semiconductor die from the first surface to the second surface.

In some examples, a method comprises positioning a first metal layer on a first surface of a first semiconductor die, the first semiconductor die having a second surface opposite the first surface. The method comprises etching an orifice in the first semiconductor die, the orifice extending through a thickness of the first semiconductor die between the first and second surfaces. The method comprises positioning a second metal layer on a surface of a second semiconductor die. The method comprises positioning a set of nanoparticles on the second metal layer. The method comprises plating a set of metallic nanowires on the set of nanoparticles. The method comprises positioning the set of metallic nanowires in the orifice such that the set of metallic nanowires couples to the first metal layer.

BRIEF DESCRIPTION OF THE DRAWINGS

For a detailed description of various examples, reference will now be made to the accompanying drawings in which:

FIGS. 1A-1F, 2A1-2F3, and 3 depict a process flow for fabricating semiconductor packages having semiconductor die orifices containing metallic nanowires, in accordance with various examples.

FIGS. 4A-4J2, 5, and 6 depict an alternative process flow for fabricating semiconductor packages having semiconductor die orifices containing metallic nanowires, in accordance with various examples.

DETAILED DESCRIPTION

As explained above, through-silicon vias (TSVs) typically comprise metal-containing orifices that extend through the thickness of a semiconductor die, coupling metal on one surface of the semiconductor die to metal on (or near) an opposing surface of the semiconductor die. TSVs are generally formed by plating (e.g., electroplating) a suitable metal, such as copper, in an orifice that extends through the thickness of the semiconductor die. Rather than merely abutting the walls of the semiconductor die orifice, the plated metal bonds to the walls of the orifice. Semiconductors, such as silicon, have a significantly different coefficient of thermal expansion (CTE) than metals, such as copper. This mismatch in CTE between the metal and the TSV semiconductor die walls to which the metal bonds results in high stress levels at the metal-semiconductor interface, resulting in compromises to structural integrity. In addition, coupling the TSV metal to other metals to establish communication pathways is an undesirably tedious process performed at high temperatures.

This disclosure describes various examples of a semiconductor die comprising metallic nanowires positioned within an orifice that extends through the thickness of the semiconductor die. Although metallic, the nanowires do not bond to the walls of the semiconductor die orifice, and thus the aforementioned challenge associated with mismatched CTEs is mitigated. In addition, the metallic nanowires have large surface area-to-volume ratios, which depress the nanowires' melting points, thereby enabling the nanowires to be fused to other surfaces at low temperatures and low pressures. For example, the metallic nanowires may fuse to another surface by gently pressing the nanowires against the surface at room temperature. In these ways, the metallic nanowires mitigate the challenges described above with respect to CTE mismatches and tedious, high-temperature TSV metal coupling processes.

Figure 7:
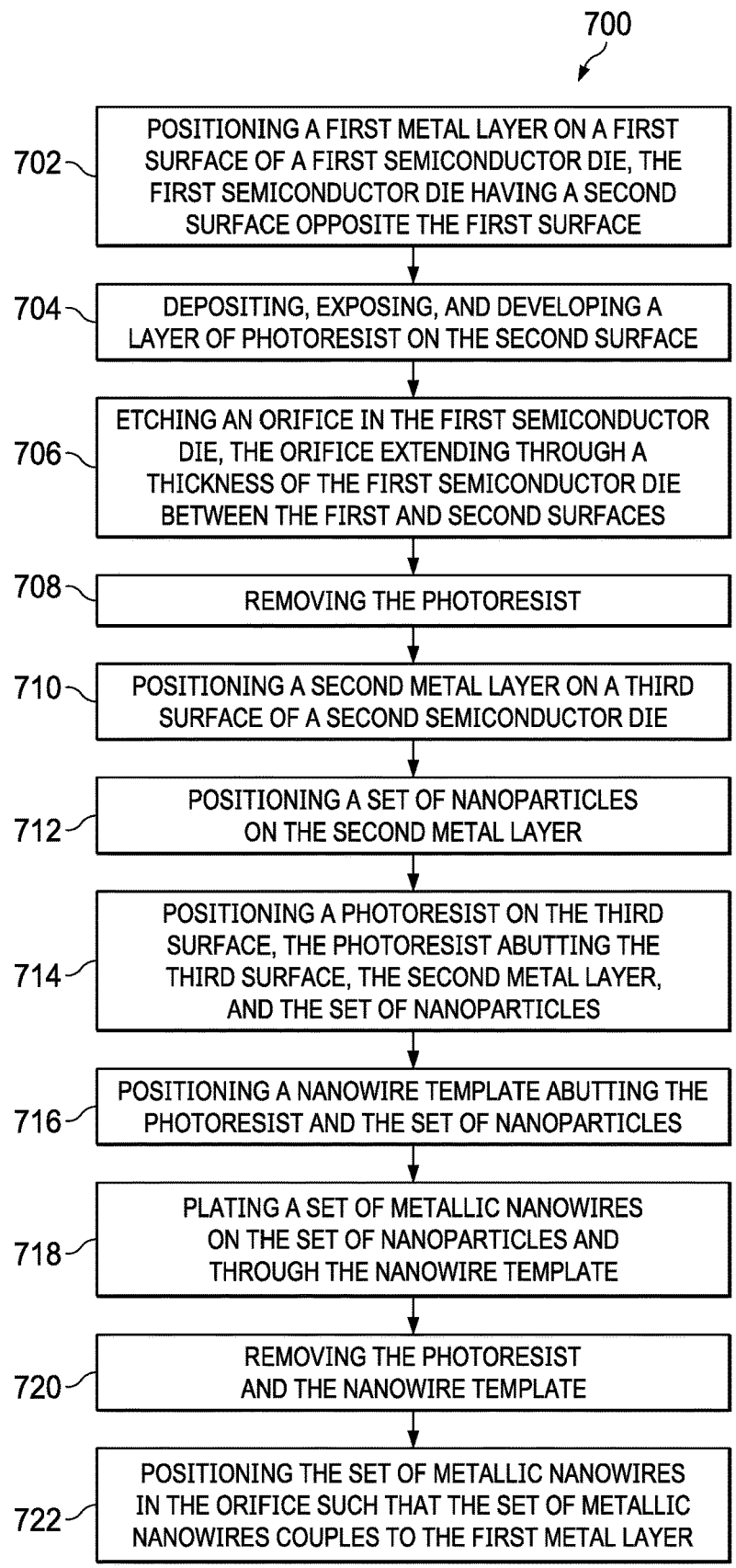
FIG. 7 is a flow diagram depicting a method corresponding to the process flow of FIGS. 1A-1F, 2A1-2F3, and 3, in accordance with various examples.

FIGS. 1A-1F, 2A1-2F4, and 3 depict a process flow for fabricating semiconductor packages having semiconductor die orifices containing metallic nanowires, in accordance with various examples. FIG. 7 is a flow diagram depicting a method 700 corresponding to the process flow of FIGS. 1A-1F, 2A1-2F4, and 3, in accordance with various examples. Accordingly, the method 700 of FIG. 7 is now described in parallel with the process flow of FIGS. 1A-1F, 2A1-2F4, and 3.

Figure 1A:
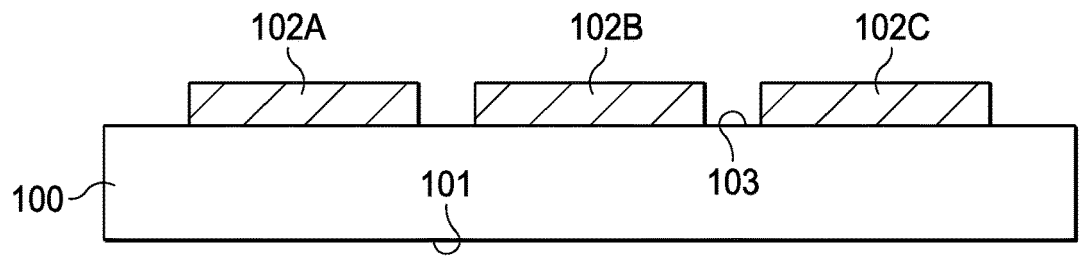

The method 700 begins with positioning a first metal layer on a first surface of a first semiconductor die, where the first semiconductor die has a second surface opposite the first surface (702). FIG. 1A depicts a semiconductor die 100 having a surface 103 on which metal layers 102A, 102B, and 102C are positioned. The first metal layer described with respect to step 702 of the method 700 may correspond to any or all of the metal layers 102A-102C. Similarly, the descriptions provided herein of the first metal layer and operations performed on the first metal layer may be extended to any or all of the metal layers 102A-102C. The scope of this disclosure is not limited to any particular number of metal layers, with fewer or more than three metal layers being contemplated and included within the scope of this disclosure. In addition, although this disclosure assumes the use of a post-singulation semiconductor die 100, the scope of this disclosure encompasses examples in which some or all of the techniques described herein are performed on a semiconductor wafer that is later singulated.

Each of the metal layers 102A-102C is deposited using any suitable technique, for example, a printing technique (e.g., additive manufacturing), a sputtering technique, or a plating technique. In some examples, each of the metal layers 102A-102C comprises a solid metal layer. In some examples, each of the metal layers 102A-102C comprises copper. In some examples, each of the metal layers 102A-102C comprises titanium. In some examples, each of the metal layers 102A-102C comprises titanium-tungsten. In some examples, each of the metal layers 102A-102C comprises nickel palladium. In some examples, each of the metal layers 102A-102C comprises a different metal or metal alloy than those recited above. In some examples, the metal layers 102A-102C have the same composition, and in other examples, one or more of the metal layers 102A-102C has a different composition than the other metal layers. Any of a variety of metals or metal alloys may be used, depending on various factors including cost, electromigration between metals, availability, etc. The physical parameters of the metal layers 102A-102C, such as length, width, and thickness, are variable and may be selected as desired, with one or more of the metal layers 102A-102C having the same or different physical parameters compared to the remaining metal layers. A surface 101 opposes the surface 103.

Figure 1B:
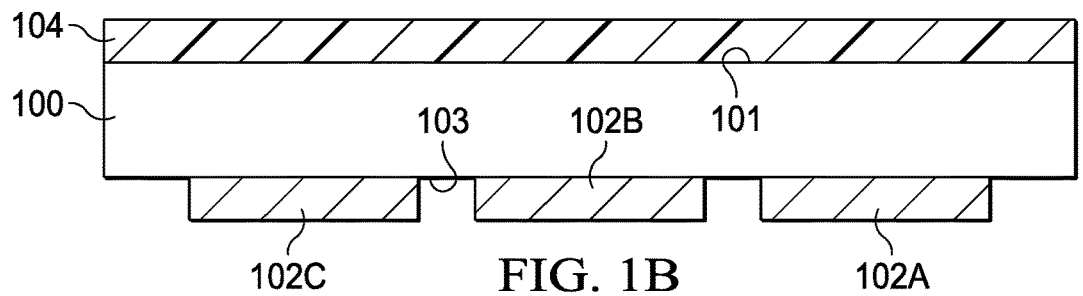
Figure 1C:
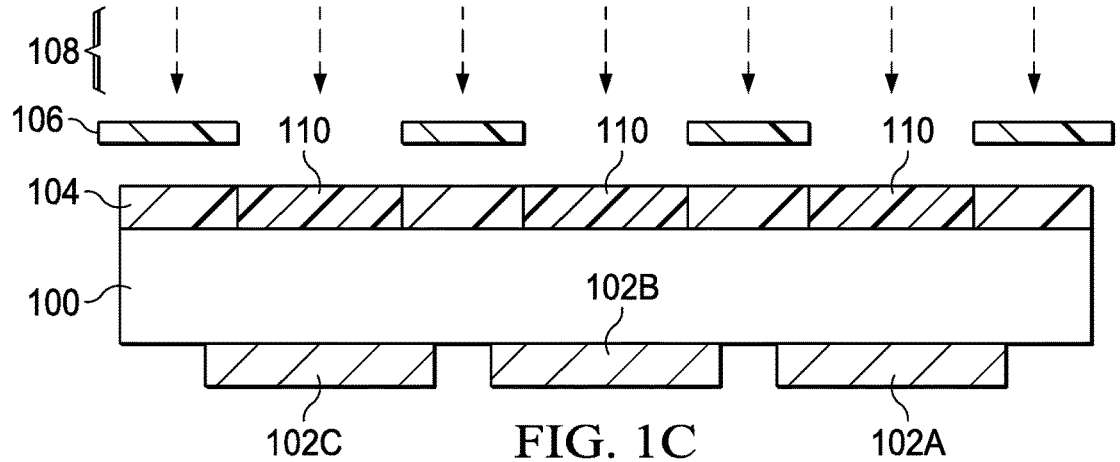
Figure 1D:
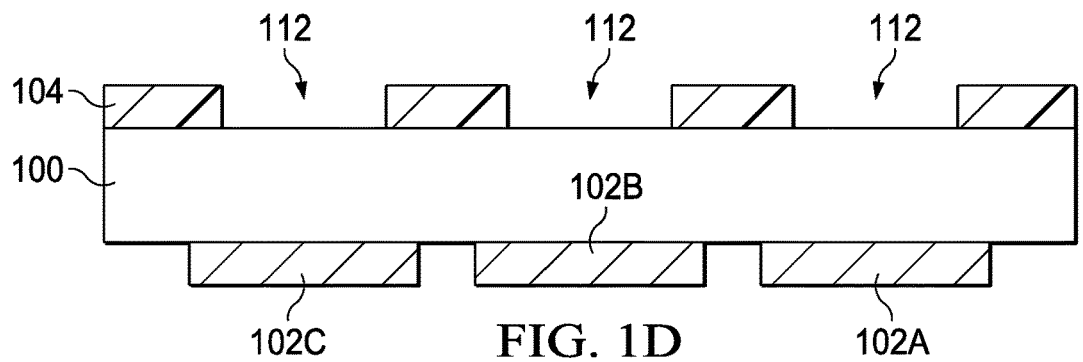

The method 700 subsequently comprises depositing, exposing, and developing a layer of photoresist on the second surface (704). In FIG. 1B, which rotates the structure of FIG. 1A by 180 degrees, a layer of photoresist 104 is deposited on the surface 101, as shown. In FIG. 1C, a mask 106, patterned appropriately to fabricate the structures described and depicted herein, is positioned above the layer of photoresist 104, and light 108 is used in conjunction with the mask 106 to expose areas 110 of the layer of photoresist 104. In FIG. 1D, the layer of photoresist 104 is developed such that the exposed areas 110 of the layer of photoresist 104 are removed, leaving behind developed areas 112.

The method 700 then comprises etching an orifice in the first semiconductor die, where the orifice extends through a thickness of the first semiconductor die between the first and second surfaces (706). FIG. 1E depicts the semiconductor die with etched orifices 114. The orifices 114 may have any suitable diameter, for example, ranging from 0.01 microns to 10 millimeters. The orifices 114 are etched below the developed areas 112 depicted in FIG. 1D. The semiconductor die may be etched using any suitable technique, such as a chemical etch. The method 700 includes removing the photoresist (708), as shown in FIG. 1F, in which the structure of FIG. 1E has been rotated 180 degrees.

The method 700 next includes positioning a second metal layer on a surface of a second semiconductor die (710). FIG. 2A1 depicts metal layers 202A, 202B, and 202C positioned on a surface 201 of a semiconductor die 200. The description provided above with respect to metal layers 102A-102C also applies to the metal layers 202A-202C. FIG. 2A2 depicts a top-down view of the structure of FIG. 2A1.

The method 700 then comprises positioning a set of nanoparticles on the second metal layer (712). FIG. 2B1 depicts the positioning of sets of nanoparticles 204A-204C on the metal layers 202A-202C, respectively. In some examples, the metals in the sets of nanoparticles 204A-204C and the metal layers 202A-202C are identical (e.g., copper, titanium, or titanium-tungsten). In other examples, the metals in the sets of nanoparticles are different. For instance, in some examples, the sets of nanoparticles 204A-204C comprise titanium or titanium-tungsten, and the metal layers 202A-202C comprise copper. In some examples, the sets of nanoparticles 204A-204C comprise nickel palladium, and the metal layers 202A-202C comprise copper. Any of a variety of metals may be used, depending on various factors including cost, migration of electromigration between metals, availability, etc.

In some examples, the sets of nanoparticles 204A-204C are deposited on the metal layers 202A-202C using a printing technique, for example an additive manufacturing technique. In some examples, the sets of nanoparticles 204A-204C are electroplated onto the metal layers 202A-202C. In some examples, the sets of nanoparticles 204A-204C are deposited using a sputtering technique. Other techniques are contemplated and included in the scope of this disclosure.

In some examples, the sets of nanoparticles 204A-204C have a thickness ranging from 100 nanometers (nm) to 100 microns, with a thicker set of nanoparticles resulting in a more mechanically stable nanoparticle-nanowire structure (as described below, nanowires will be plated on the sets of nanoparticles 204A-204C). In some examples, the length and width of each of the sets of nanoparticles 204A-204C is less than the length and width of the corresponding metal layer 202A-202C. For instance, in some examples, the width of each set of nanoparticles 204A-204C is 75%-100% of the width of the corresponding metal layer 202A-202C. In some examples, the width of each set of nanoparticles 204A-204C is 50%-75% of the width of the corresponding metal layer 202A-202C. In some examples, the width of each set of nanoparticles 204A-204C is 25%-50% of the width of the corresponding metal layer 202A-202C. Other relative sizes are contemplated and included in the scope of this disclosure. Similar relative sizes may be used for the lengths of the sets of nanoparticles 204A-204C and the corresponding metal layers 202A-202C. These relative length and width selections are not mere design choices; rather, they result in different levels of mechanical strength and current carrying capability of the metallic nanowires described below, due to the ability of larger sets of nanoparticles to couple to greater numbers of metallic nanowires, and vice versa. The length and width selections may also affect melting points of the sets of nanoparticles, with larger sets of nanoparticles having higher melting points, and vice versa. The remaining dimensions of the sets of nanoparticles 204A-204C may be chosen as desired.

In some examples, each nanoparticle in the sets of nanoparticles 204A-204C is generally spherical and has a diameter ranging from approximately 0.01 microns to 1.5 microns. In some examples, each nanoparticle in the sets of nanoparticles 204A-204C has a diameter of 1.5 microns or less. The diameter may affect, for example, the melting point of a nanoparticle and thus is not merely a design choice. The specific physical parameters of the sets of nanoparticles 204A-204C and the individual nanoparticles within the sets of nanoparticles 204A-204C may vary, and all such variations are encompassed within the scope of this disclosure. The number of metal layers (and attendant sets of nanoparticles) may be chosen as desired, with certain applications benefiting from more and other applications benefiting from fewer.

After the sets of nanoparticles 204A-204C are deposited onto the metal layers 202A-202C, the sets of nanoparticles 204A-204C are melted to cause the nanoparticles in the sets of nanoparticles 204A-204C to diffuse into the metal layers 202A-202C. Any suitable technique may be used to melt the sets of nanoparticles 204A-204C, for example a laser technique or a technique using any other heat source. The diameters of the nanoparticles in the sets of nanoparticles 204A-204C, as well as the thicknesses of the sets of nanoparticles 204A-204C, may at least partially determine the melting points of the sets of nanoparticles 204A-204C. In some examples, a nanoparticle diameter of approximately 1 micron and a thickness for each of the sets of nanoparticles 204A-204C of approximately 100 nm may result in a melting point of approximately 200 degrees Fahrenheit, although the specific number can vary based on a variety of factors (e.g., metal used, physical parameters of the nanoparticles in the sets of nanoparticles 204A-204C). FIG. 2B2 shows a top-down view of the structure of FIG. 2B1.

The method 700 subsequently comprises positioning a photoresist on the surface of the second semiconductor die, where the photoresist abuts the surface of the second semiconductor die, the second metal layer, and the set of nanoparticles (714). FIG. 2C1 depicts a photoresist 206 applied using any suitable technique such that the photoresist 206 abuts the surface 201, the metal layers 202A-202C, and the sets of nanoparticles 204A-204C. FIG. 2C2 depicts a top-down view of the structure of FIG. 2C1.

The method 700 additionally includes positioning a nanowire template abutting the photoresist and the set of nanoparticles (716). FIG. 2D1 depicts a nanowire template 208 abutting the photoresist 206 and the sets of nanoparticles 204A-204C. The nanowire template 208 includes sets of orifices 210 positioned above the sets of nanoparticles 204A-204C and extending perpendicularly to the metal layers 202A-202C. This nanowire template 208 may comprise, for example, a TEFLON® (polytetrafluoroethylene) filter. In other examples, the nanowire template 208 comprises plastic. In some examples, the nanowire template 208 comprises any suitable type of metal (e.g., anodized aluminum or nickel). The nanowire template 208 rests on the photoresist 206 and on the sets of nanoparticles 204A-204C as shown. The photoresist 206 is not needed to mechanically support the nanowire template 208; because the sets of nanoparticles 204A-204C are negligibly thin in actual implementation, the nanowire template 208 may simultaneously rest on the sets of nanoparticles 204A-204C and the metal layers 202A-202C in the absence of the photoresist 206. Rather, the photoresist 206 is present in some examples to adhere to the nanowire template 208 in the event that the nanowire template 208 is composed of a material that does not adhere firmly to the metal layers 202A-202C and the semiconductor die 200. If the nanowire template 208 is composed of a material that adheres firmly to the metal layers 202A-202C and the semiconductor die 200, the photoresist 206 may be omitted.

Referring still to FIG. 2D1, as explained above, the nanowire template 208 includes groups of orifices 210 extending perpendicularly to the metal layers 202A-202C (or, in the absence of the metal layers 202A-202C, perpendicularly to the semiconductor die 200). Each group of orifices 210 is positioned above a different set of nanoparticles 204A-204C, as shown. FIG. 2D2 depicts a top-down view of the structure of FIG. 2D1. The method 700 comprises plating (e.g., electroplating) a set of metallic nanowires on the set of nanoparticles and through the nanowire template (718). As FIG. 2E1 depicts, sets of metallic nanowires 212A-212C are plated onto the sets of nanoparticles 204A-204C. Any suitable metal may be used when plating the sets of metallic nanowires 212A-212C. In some examples, gold is used to plate the sets of metallic nanowires 212A-212C. In some examples, copper is used to plate the sets of metallic nanowires 212A-212C. In some examples, titanium is used to plate the sets of metallic nanowires 212A-212C. In some examples, tungsten is used to plate the sets of metallic nanowires 212A-212C.

Still referring to FIG. 2E1, in some examples, the orifices 210 (in FIG. 2E1, filled by the sets of metallic nanowires 212A-212C) in the nanowire template 208 are sized appropriately to form wires at a nanoscale. For example, a nanowire in the sets of metallic nanowires 212A-212C may have a length that is at least twice its diameter. In some examples, a nanowire in the sets of metallic nanowires 212A-212C has a length that is at least 10 times its diameter. In some examples, a nanowire in the sets of metallic nanowires 212A-212C has a length that is at least 100 times its diameter. In some examples, a nanowire in the sets of metallic nanowires 212A-212C has a length that is at least 1000 times its diameter. In some examples, a nanowire in the sets of metallic nanowires 212A-212C has a diameter ranging from 0.5 microns to 1.5 microns. In some examples, a nanowire in the sets of metallic nanowires 212A-212C has a diameter of 1 micron. In some examples, a nanowire in the sets of metallic nanowires 212A-212C has a diameter ranging from 0.1 microns to 1 millimeter. In some examples, a nanowire in the sets of metallic nanowires 212A-212C has a length of at least 2 microns. In some examples, a nanowire in the sets of metallic nanowires 212A-212C has a diameter ranging from 5 nanometers to 100 microns and a length ranging from 10 microns to 1000 microns. In other examples, other diameters and length-to-diameter ratios of nanowires are contemplated, and all such measurements and combinations fall within the scope of this disclosure. The orifices 210 may have dimensions similar to the example dimensions given for the nanowires above. FIG. 2E2 depicts a top-down view of the structure of FIG. 2E1.

The various dimensions described for the sets of metallic nanowires 212A-212C (and the orifices 210) are not mere design choices. Rather, adjusting each dimension to be larger or smaller may provide specific functional benefits. For example, adjusting a nanowire length to be greater and/or a nanowire diameter to be smaller, such that the ratio of length to diameter increases, may increase the surface area-to-volume ratio of the nanowire. Increasing the surface area-to-volume ratio of the nanowire increases the number of defects present, thereby depressing the melting point of the nanowire and making it easier to fuse the nanowire to other materials, for example, without requiring high temperature or pressure.

Figure 3:
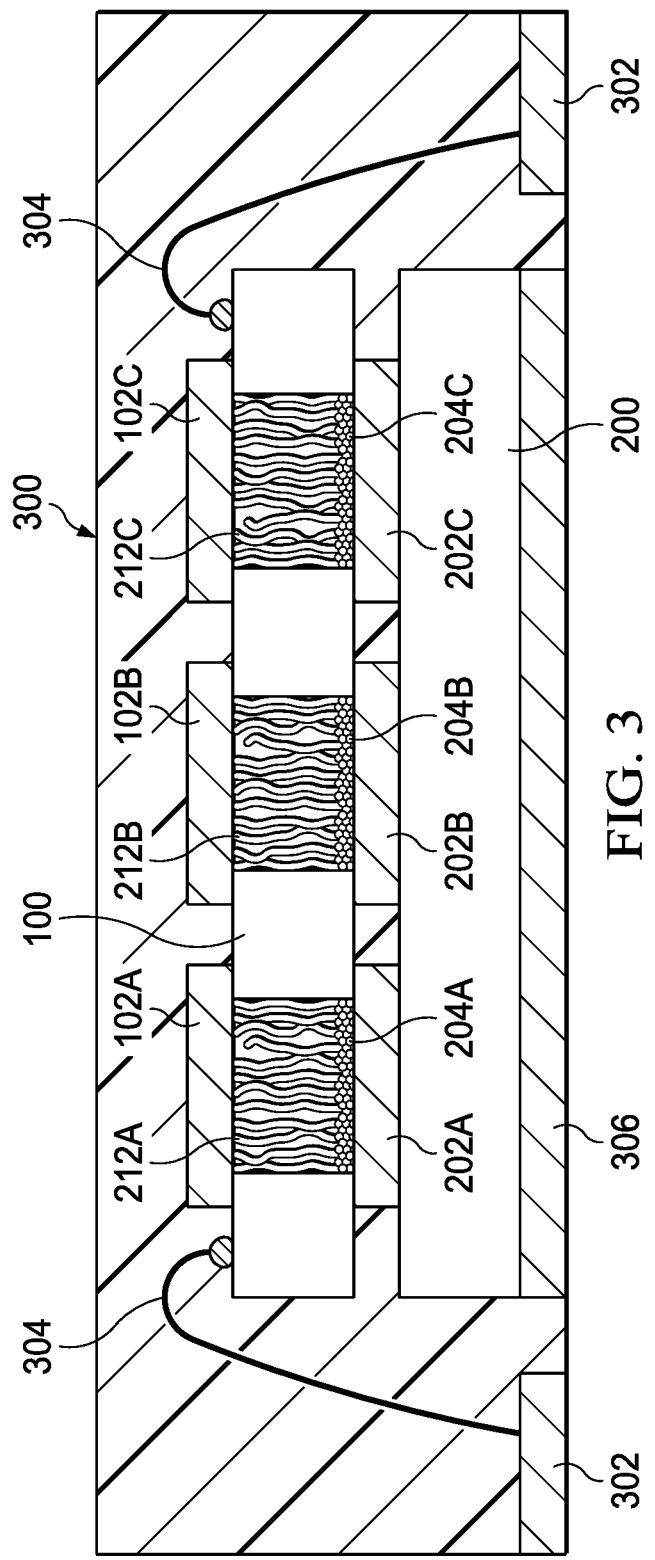

The method 700 subsequently comprises removing the photoresist and the nanowire template (720). FIG. 2F1 depicts this removal of the photoresist 206 and the nanowire template 208. FIG. 2F2 is a top-down view of the structure of FIG. 2F1. FIG. 2F3 depicts a more detailed top-down view of a set of nanoparticles, for example, the set of nanoparticles 204A, with the set of nanowires 212A omitted from this view for clarity. In examples where the nanowire template 208 comprises TEFLON® or plastic, the photoresist 206 and the nanowire template 208 may be removed using any suitable technique, for example, organic stripping, wet inorganic stripping, or dry stripping. In examples where the nanowire template 208 comprises a metal or metal alloy, the nanowire template 208 may be removed using a corresponding metal etch.

In FIGS. 2B1-2F3 and 3, sets of nanoparticles 204A-204C are positioned on metal layers 202A-202C. In at least some such examples, the metal layers 202A-202C are solid metal layers. In other examples, however, the sets of nanoparticles 204A-204C may be omitted, and the sets of metallic nanowires 212A-212C may be plated directly on the metal layers 202A-202C. In yet other examples, the sets of nanoparticles 204A-204C may be omitted, and the metal layers 202A-202C may themselves be or include sets of nanoparticles. Any and all such variations in the inclusion, exclusion, and arrangement of metal layers, sets of nanoparticles, and sets of metallic nanowires are contemplated and included in the scope of this disclosure.

The method 700 comprises positioning the set of metallic nanowires in the orifice such that the set of metallic nanowires couples to the first metal layer (722). The resulting structure may be incorporated into a semiconductor package. For example, FIG. 3 depicts a semiconductor package 300 comprising conductive terminals (e.g., leads) 302 and a die pad 306. The semiconductor die 200 is positioned on the die pad 306 (e.g., using a suitable die attach material). Bond wires 304 may couple a surface (e.g., an active surface) of the semiconductor die 100 to the conductive terminals 302, as shown. The metal layers 202A-202C couple to the semiconductor die 100, as shown. The sets of metallic nanowires 212A-212C, which are plated from the sets of nanoparticles 204A-204C, are positioned inside the orifices 114 of the semiconductor die 100 such that the sets of metallic nanowires 212A-212C couple to the metal layers 102A-102C, respectively. The sets of metallic nanowires 212A-212C may couple to the metal layers 102A-102C by melting and fusing to the metal layers 102A-102C. As explained above, nanowires have large surface area-to-volume ratios, which depress the melting points of the nanowires. For example, at room temperature, pressing a metallic nanowire against another metallic object (e.g., another metallic nanowire or the metal layers 102A-102C) at pressures greater than 100 MPa is sufficient to cause fusion of the metallic nanowire to the metallic object. In another example, temperatures of 175 degrees Fahrenheit are sufficient to cause fusion without any additional pressure being added. Other combinations of pressure and temperature sufficient to cause melting and subsequent fusion of nanowires also may be used. Similar temperatures and pressures may cause individual nanowires in the set of metallic nanowires 212A to fuse to each other, individual nanowires in the set of metallic nanowires 212B to fuse to each other, and/or individual nanowires in the set of metallic nanowires 212C to fuse to each other.

Figure 8:
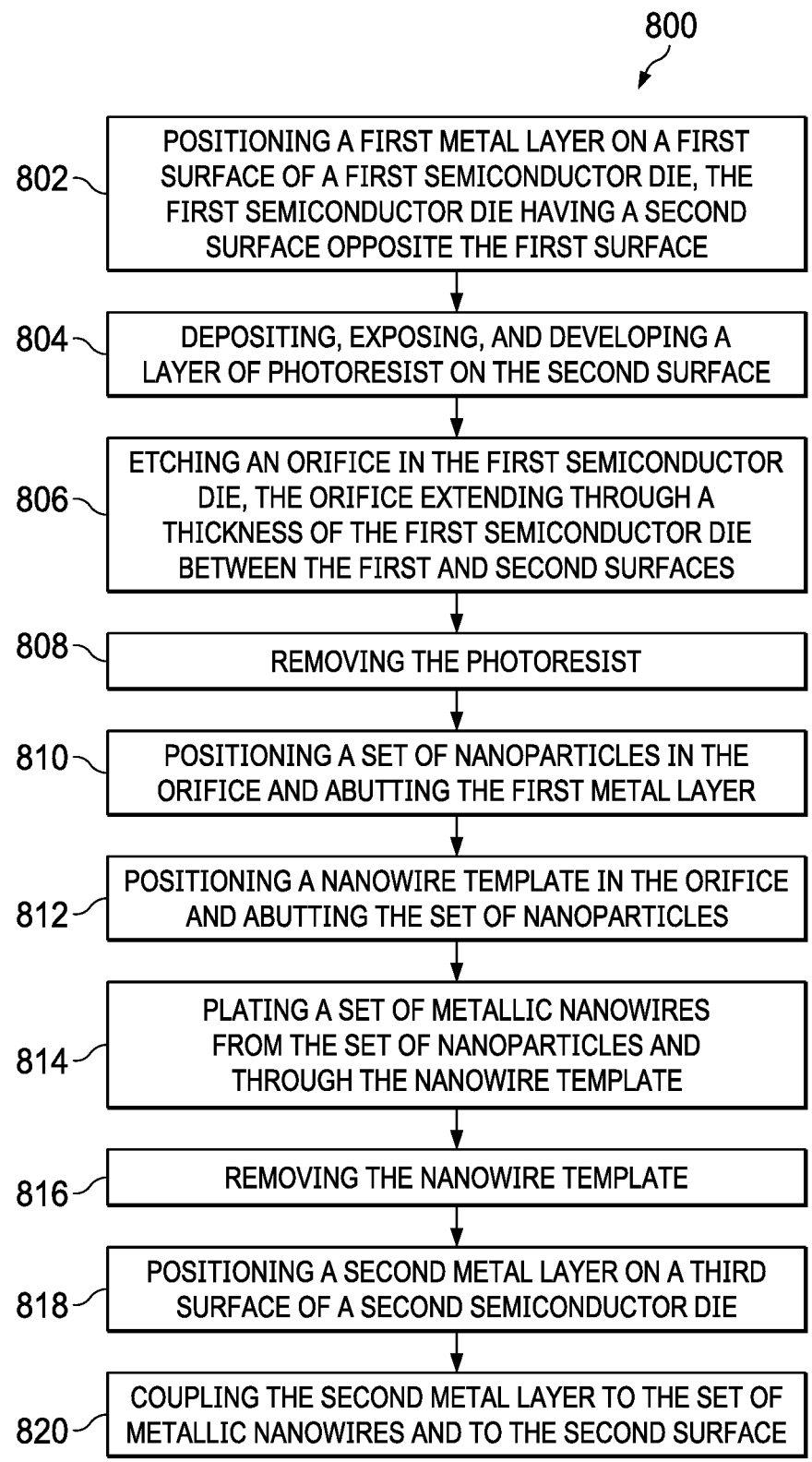
FIG. 8 is a flow diagram depicting an alternative method corresponding to the process flow of FIGS. 4A-4J2, 5, and 6, in accordance with various examples.

FIGS. 4A-4J2, 5, and 6 depict a process flow for fabricating semiconductor packages having semiconductor die orifices containing metallic nanowires, in accordance with various examples. FIG. 8 is a flow diagram depicting a method 800 corresponding to the process flow of FIGS. 4A-4J2, 5, and 6, in accordance with various examples. Accordingly, the method 800 of FIG. 8 is now described in parallel with the process flow of FIGS. 4A-4J2, 5, and 6.

Figure 4A:
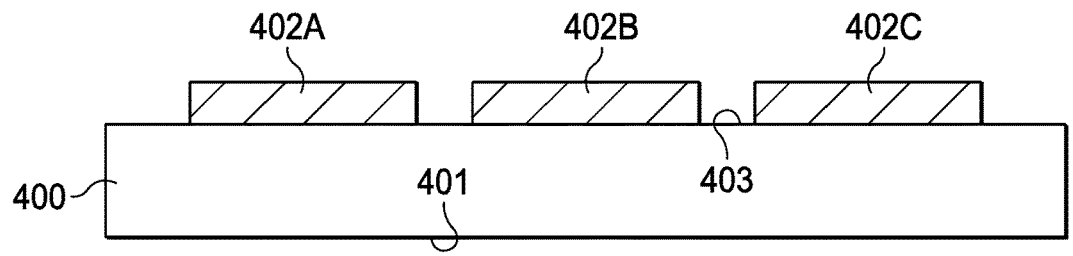

The method 800 begins with positioning a first metal layer on a first surface of a first semiconductor die, where the first semiconductor die has a second surface opposite the first surface (802). FIG. 4A depicts a semiconductor die 400 having a surface 403 on which metal layers 402A, 402B, and 402C are positioned. The first metal layer described with respect to step 802 of the method 800 may correspond to any of the metal layers 402A-402C. Similarly, the descriptions provided herein of the first metal layer and operations performed on the first metal layer may be extended to any of the metal layers 402A-402C. The scope of this disclosure is not limited to any particular number of metal layers, with fewer or more than three metal layers being contemplated and included within the scope of this disclosure. In addition, although this disclosure assumes the use of a post-singulation semiconductor die 400, the scope of this disclosure encompasses examples in which some or all of the techniques described herein are performed on a semiconductor wafer that is later singulated. A surface 401 opposes the surface 403.

Each of the metal layers 402A-402C is deposited using any suitable technique, for example, a printing technique (e.g., additive manufacturing), a sputtering technique, or a plating technique. In some examples, each of the metal layers 402A-402C comprises a solid metal layer. In some examples, each of the metal layers 402A-402C comprises copper. In some examples, each of the metal layers 402A-402C comprises titanium. In some examples, each of the metal layers 402A-402C comprises titanium-tungsten. In some examples, each of the metal layers 402A-402C comprises nickel palladium. In some examples, each of the metal layers 402A-402C comprises a different metal or metal alloy than those recited above. In some examples, the metal layers 402A-402C have the same composition, and in other examples, one or more of the metal layers 402A-402C has a different composition than the other metal layers. Any of a variety of metals or metal alloys may be used, depending on various factors including cost, electromigration between metals, availability, etc. The physical parameters of the metal layers 402A-402C, such as length, width, and thickness, are variable and may be selected as desired, with one or more of the metal layers 402A-402C having the same or different physical parameters compared to the remaining metal layers.

Figure 4B:
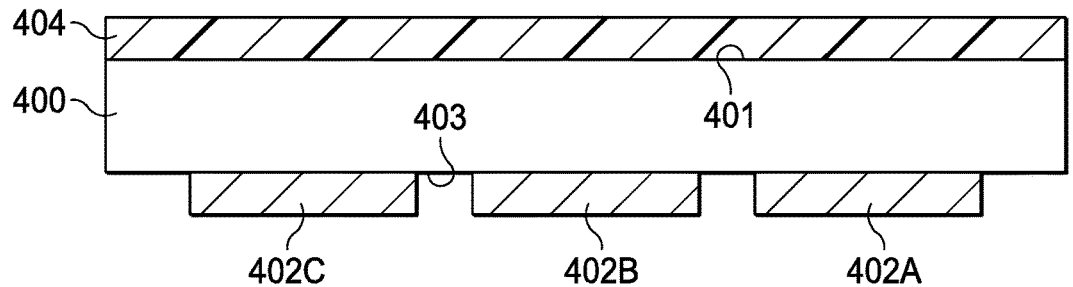
Figure 4C:
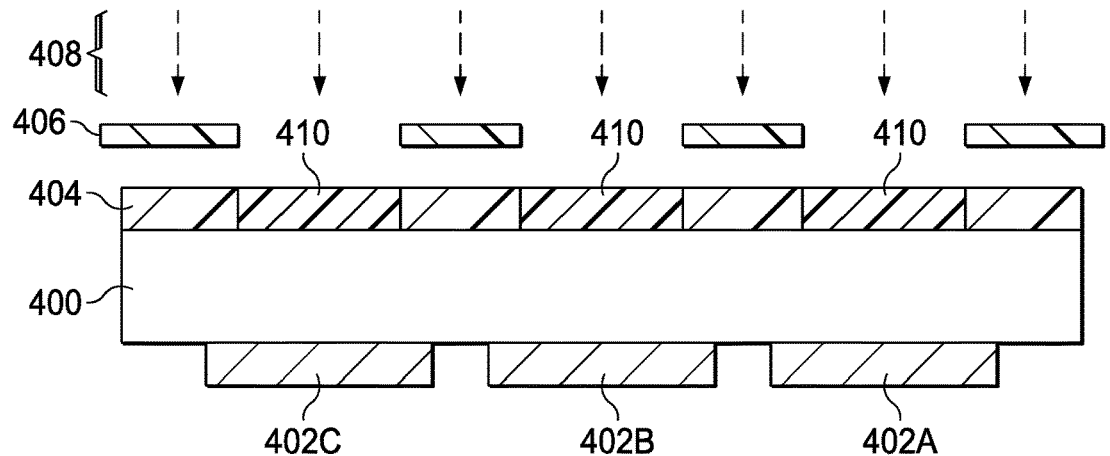
Figure 4D:
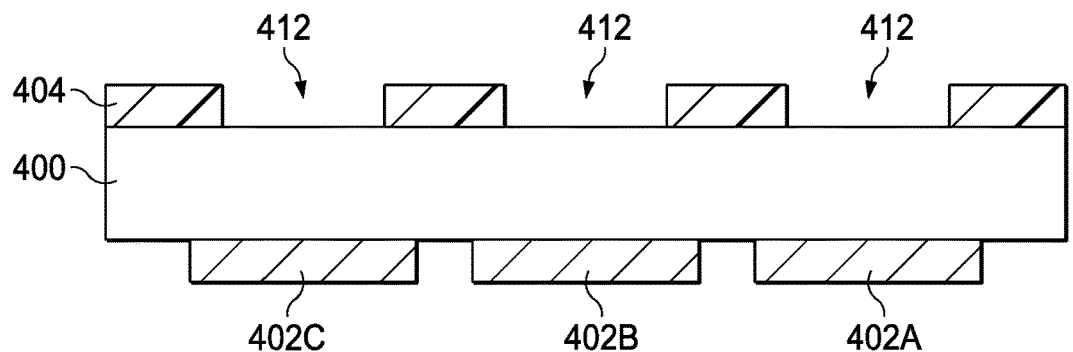

The method 800 subsequently comprises depositing, exposing, and developing a layer of photoresist on the second surface (804). A layer of photoresist 404 is deposited on the surface 401, as shown in FIG. 4B. In FIG. 4C, a mask 406, patterned appropriately to fabricate the structures described and depicted herein, is positioned above the layer of photoresist 404, and light 408 is used in conjunction with the mask 406 to expose areas 410 of the layer of photoresist 404. In FIG. 4D, the layer of photoresist 404 is developed such that the exposed areas 410 of the layer of photoresist 404 are removed, leaving behind developed areas 412.

The method 800 then comprises etching an orifice in the first semiconductor die, where the orifice extends through a thickness of the first semiconductor die between the first and second surfaces (806). FIG. 4E depicts the semiconductor die with etched orifices 414. The orifices 414 are etched (e.g., using a chemical etch) below the developed areas 412 depicted in FIG. 4D. The method 800 includes removing the photoresist (808), as shown in the profile view of FIG. 4F1 and in the top-down view of FIG. 4F2. The photoresist 404 may be removed, for example, using a suitable resist stripping technique, such as a wet or dry etch.

The method 800 subsequently comprises positioning a set of nanoparticles in the orifice and abutting the first metal layer (810). FIG. 4G1 depicts the positioning of sets of nanoparticles 416A-416C in the orifices 414 and abutting the metal layers 402A-402C, respectively. The sets of nanoparticles 416A-416C may be deposited using the same or similar techniques as those used to deposit the sets of nanoparticles 204A-204C, described above. Similarly, the physical parameters of the sets of nanoparticles 416A-416C, such as length, width, thickness, and composition, may be the same or similar as the physical parameters described above for the sets of nanoparticles 204A-204C. FIG. 4G2 shows a top-down view of the structure of FIG. 4G1.

At 812, the method 800 comprises positioning at least part of a nanowire template in the orifice and abutting the set of nanoparticles. FIG. 4H1 depicts a nanowire template 418 partially positioned in the orifices 414 of FIG. 4G1. A remainder of the nanowire template 418 is positioned abutting the surface 401. The portions of the nanowire template 418 positioned within the orifices 414 may include numerous orifices 420, and the portions of the nanowire template 418 abutting the surface 401 may be solid (e.g., lacking orifices). The portions of the nanowire template 418 extending into the orifices 414 may be rigid so that the orifices 420 maintain uniform diameters along their lengths, rendering the orifices 420 suitable for plating nanowires. For example, the portions of the nanowire template 418 extending into the orifices 414 may be sufficiently rigid such that the orifices 420 maintain an approximately 1 micron diameter along their lengths, such that nanowires having 1 micron diameters may be plated through the orifices 420. FIG. 4H2 depicts a top-down view of the structure of FIG. 4H1.

The method 800 further comprises plating a set of metallic nanowires from the set of nanoparticles and through the nanowire template (814). As FIG. 411 depicts, sets of metallic nanowires 422A-422C are plated (e.g., electroplated) on the sets of nanoparticles 416A-416C, respectively. Any suitable metal may be used when plating the sets of metallic nanowires 422A-422C. In some examples, gold is used to plate the sets of metallic nanowires 422A-422C. In some examples, copper is used to plate the sets of metallic nanowires 422A-422C. In some examples, titanium is used to plate the sets of metallic nanowires 422A-422C. In some examples, tungsten is used to plate the sets of metallic nanowires 422A-422C. FIG. 412 is a top-down view of the structure of FIG. 411. The nanowires in the sets of metallic nanowires 422A-422C may have the same or similar physical parameters as the nanowires in the sets of metallic nanowires 212A-212C described above. Similarly, the orifices 420 may have the same or similar physical parameters as the orifices 210 described above.

The nanowire template may then be removed (816). In FIG. 4J1, the nanowire template 418 is removed, for example, using the same resist stripping technique as used for the photoresist 404 (in the case of a TEFLON® or plastic nanowire template 418) or using a specific metal etch corresponding to the metal of which the nanowire template 418 is composed. FIG. 4J2 depicts a top-down view of the structure of FIG. 4J1.

The method 800 then comprises positioning a second metal layer on a surface of a second semiconductor die (818). FIG. 5 depicts the positioning of metal layers 502A-502C on a semiconductor die 500. The lengths, widths, thicknesses, and compositions of the metal layers 502A-502C, in some examples, are the same or similar to those of the metal layers 402A-402C.

Figure 6:
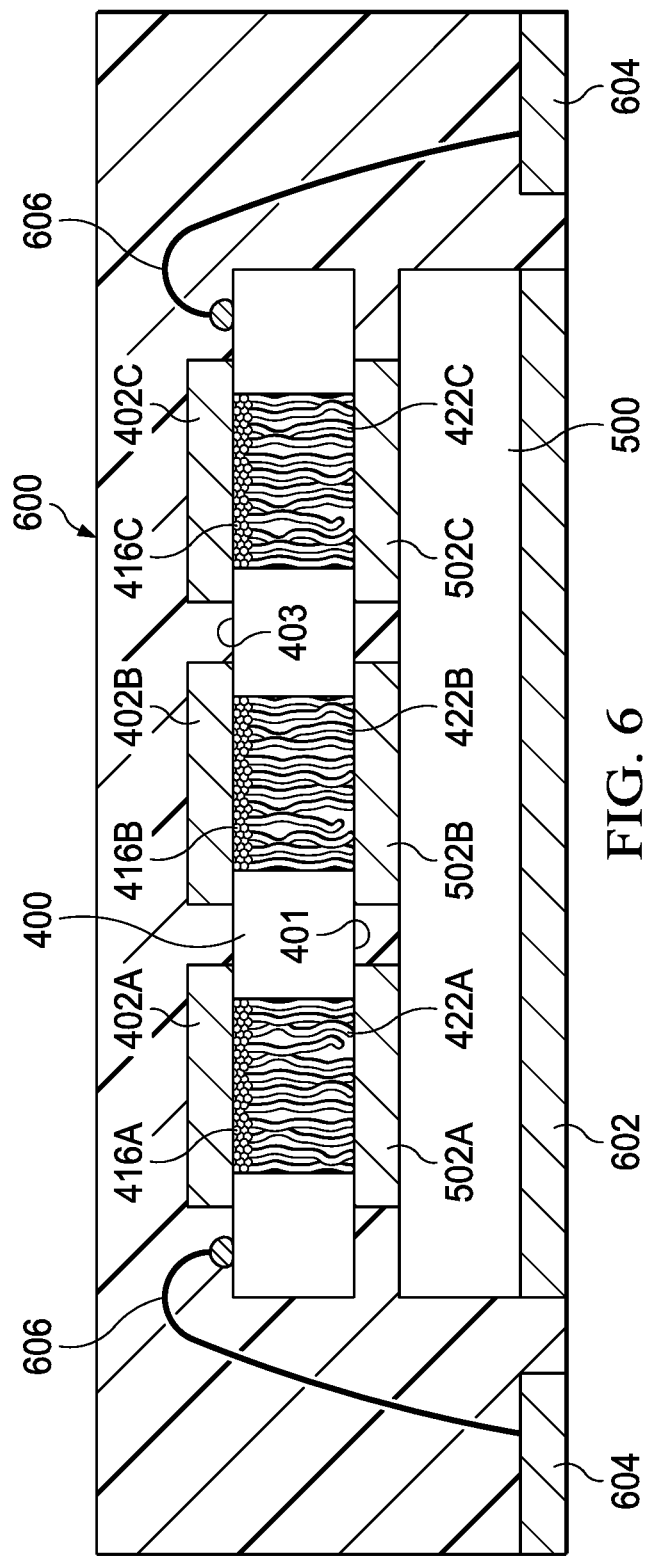

The method 800 comprises coupling the second metal layer to the set of metallic nanowires and to the second surface (820). For example, as FIG. 6 depicts, the structures of FIGS. 4J1 and 5 are coupled such that the metal layers 502A-502C couple to the sets of metallic nanowires 422A-422C and to the surface 401 of the semiconductor die 400. As explained in detail above, the sets of metallic nanowires 422A-422C may fuse to each other and/or to the metal layers 502A-502C with an adequate combination of pressure and ambient temperature. The metal layers 502A-502C may couple to the surface 401 with or without the use of an adhesive. In some examples, an adhesive such as an epoxy or a die attach material may be used to couple the metal layers 502A-502C to the surface 401. In other examples, the coupling of the sets of metallic nanowires 422A-422C to the metal layers 502A-502C is adequate to keep the metal layers 502A-502C in contact with the surface 401, and in some such examples, no separate adhesive is used to couple the metal layers 502A-502C to the surface 401. Bond wires 606 are used to couple the surface (e.g., an active surface) 403 of the semiconductor die 400 to conductive terminals (e.g., leads) 604. The semiconductor die 500 may couple to a die pad 602 using, e.g., a suitable die attach material, such as an epoxy or solder paste. The structure of FIG. 6 may be covered using a mold compound or epoxy to form a semiconductor package 600.

In FIGS. 4G1-4J2 and 6, sets of nanoparticles 416A-416C are positioned on metal layers 402A-402C. In at least some such examples, the metal layers 402A-402C are solid metal layers. In other examples, however, the sets of nanoparticles 416A-416C may be omitted, and the sets of metallic nanowires 422A-422C may be plated directly on the metal layers 402A-402C. In yet other examples, the sets of nanoparticles 416A-416C may be omitted, and the metal layers 402A-402C may themselves be or include sets of nanoparticles. Any and all such variations in the arrangement of metal layers, sets of nanoparticles, and sets of metallic nanowires are contemplated and included in the scope of this disclosure.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A semiconductor package, comprising:
  a semiconductor die having a first surface and a second surface opposing the first surface;
  an orifice extending through a thickness of the semiconductor die from the first surface to the second surface;
  a set of metallic nanowires positioned within the orifice and extending through the thickness of the semiconductor die from the first surface to the second surface; and
  a metal layer on the first surface of the semiconductor die, one end of the metallic nanowires are fused to the metal layer.

2. A semiconductor package, comprising:
  a semiconductor die having a first surface and a second surface opposing the first surface;
  an orifice extending through a thickness of the semiconductor die from the first surface to the second surface;
  a first metal layer on the first surface;

a second metal layer on the second surface;

a set of metallic nanowires positioned within the orifice and extending through the thickness of the semiconductor die from the first metal layer to the second metal layer, one end of each of the metallic nanowires is fused to the first metal layer and a second end of each of the metallic nanowires is plated to the second metal layer; and a second semiconductor die on the second metal layer.

3. The semiconductor package of claim 2, wherein the second metal layer comprises a set of nanoparticles.

4. The semiconductor package of claim 2, further comprising a set of nanoparticles positioned on the second metal layer and within the orifice, the set of metallic nanowires are plated to the set of nanoparticles.

5. The semiconductor package of claim 4, wherein a nanoparticle in the set of nanoparticles has a diameter ranging from 0.01 microns to 1.50 microns.

6. The semiconductor package of claim 2, wherein a nanowire in the set of metallic nanowires have a length-to-diameter ratio of at least 2:1.

7. The semiconductor package of claim 2, wherein the orifice has a diameter ranging from 0.1 microns to 2 millimeters.

8. The semiconductor package of claim 2, wherein a nanowire in the set of metallic nanowires has a diameter ranging from 5 nanometers to 100 microns and a length ranging from 10 microns to 1000 microns.

9. A semiconductor package, comprising:
a first semiconductor die having a first surface and a second surface opposing the first surface, an orifice extending through the first semiconductor die from the first surface to the second surface;
a first metal layer positioned on the first surface;
a second metal layer positioned on the second surface;
a set of metallic nanowires positioned inside the orifice and coupled to the first and second metal layers, wherein a first end of each of the metallic nanowires is fused to the first metal layer and a second end of each of the metallic nanowires is plated to the second metal layer; and
a second semiconductor die coupled to the second metal layer.

10. The semiconductor package of claim 9, wherein the second metal layer comprises a set of nanoparticles, the set of metallic nanowires extending from the set of nanoparticles.

11. The semiconductor package of claim 9, further comprising a set of nanoparticles positioned on the second metal layer and within the orifice, the set of metallic nanowires extending from the set of nanoparticles.

12. The semiconductor package of claim 11, wherein a nanowire in the set of metallic nanowires has a diameter ranging from 5 nanometers to 100 microns, and wherein the nanowire has a length ranging from 10 microns to 1000 microns.

13. The semiconductor package of claim 9, wherein the orifice has a diameter ranging from 0.1 microns to 2 millimeters.

14. A method, comprising:
positioning a first metal layer on a first surface of a first semiconductor die, the first semiconductor die having a second surface opposite the first surface;
etching an orifice in the first semiconductor die, the orifice extending through a thickness of the first semiconductor die between the first and second surfaces;
positioning a second metal layer on a surface of a second semiconductor die;
positioning a set of nanoparticles on the second metal layer;
plating a set of metallic nanowires on the set of nanoparticles;
positioning the set of metallic nanowires and second nanoparticles in the orifice; and
fusing ends of the metallic nanowires, not plated to the nanoparticles, to the first metal layer.

15. The method of claim 14, wherein plating the set of metallic nanowires on the set of nanoparticles comprises using a nanowire template having a plurality of orifices, plating material filling the orifices, in the nanowire template having a diameter less than 100 microns.

16. The method of claim 14, wherein the orifices have a diameter ranging from 0.1 microns to 2 millimeters.

17. The method of claim 14, wherein a nanowire in the set of metallic nanowires has a length-to-diameter ratio of at least 10:1.

18. The method of claim 14, wherein a nanoparticle in the set of nanoparticles has a diameter of less than 1.5 microns.

19. The method of claim 14, wherein the nanowires are directly connected to the first metal layer.

20. A method, comprising:
positioning a first metal layer on a first surface of a first semiconductor die, the first semiconductor die having a second surface opposite the first surface;
etching an orifice in the first semiconductor die, the orifice extending through a thickness of the first semiconductor die between the first and second surfaces;
positioning a first metal layer on a first surface of a second semiconductor die, the second semiconductor die having a second surface opposite the first surface;
positioning a set of nanoparticles on a side of the first metal layer on the first surface of the second semiconductor die facing away from the second semiconductor die;
plating a set of metallic nanowires on the set of nanoparticles in the orifice; and
fusing an end of the metallic nanowires not attached to the set of nanoparticles to the first metal layer on a first surface of the first semiconductor die.

21. The method of claim 20, wherein plating the set of metallic nanowires on the set of nanoparticles comprises using a nanowire template having a plurality of orifices, an orifice in the nanowire template having a diameter less than 100 microns.

22. The method of claim 20, wherein the orifice has a diameter ranging from 0.1 microns to 2 millimeters.

23. The method of claim 20, wherein a nanowire in the set of metallic nanowires has a length-to-diameter ratio of at least 10:1.

24. The method of claim 20, wherein a nanoparticle in the set of nanoparticles has a diameter of less than 1.5 microns.

25. The method of claim 20, wherein the nanowires are directly connected to the second metal layer.

* * * * *